United States Patent
Meier et al.

(10) Patent No.: US 9,866,192 B2
(45) Date of Patent: Jan. 9, 2018

(54) FILTER COMPONENT WITH WINDINGLESS MAGNETIC TOROIDAL CORE

(71) Applicant: Schaffner EMV AG, Luterbach (CH)

(72) Inventors: Samuel Meier, Subingen (CH); Christian Ackermann, Solothurn (CH)

(73) Assignee: Schaffner Emv AG (CH)

( * ) Notice: Subject to any disclaimer, the term of this patent is extended or adjusted under 35 U.S.C. 154(b) by 96 days.

(21) Appl. No.: 14/831,327

(22) Filed: Aug. 20, 2015

(65) Prior Publication Data

US 2016/0065164 A1    Mar. 3, 2016

(30) Foreign Application Priority Data

Sep. 2, 2014    (DE) .......................... 10 2014 112 614

(51) Int. Cl.
| | | |
|---|---|---|
| H03H 1/00 | (2006.01) | |
| H01F 27/26 | (2006.01) | |
| H01F 17/06 | (2006.01) | |
| H01F 27/02 | (2006.01) | |
| H01F 27/24 | (2006.01) | |
| H03H 7/01 | (2006.01) | |

(52) U.S. Cl.
CPC .......... *H03H 1/0007* (2013.01); *H01F 17/06* (2013.01); *H01F 27/02* (2013.01); *H01F 27/24* (2013.01); *H01F 27/266* (2013.01); *H03H 7/0138* (2013.01); *H01F 2017/065* (2013.01)

(58) Field of Classification Search
CPC .............. H01F 17/06; H01F 2017/065; H01F 2017/067; H01F 17/041; H01F 27/26; H01F 27/263; H01F 27/266; H01F 27/02; H01F 27/24; H03H 1/0007; H03H 7/0138
USPC ............. 333/177, 185, 12, 181; 336/90, 229
See application file for complete search history.

(56) References Cited

U.S. PATENT DOCUMENTS

| | | | |
|---|---|---|---|
| 5,291,172 A | 3/1994 | Ito et al. | |
| 5,506,909 A | 4/1996 | Perng | |
| 5,942,964 A | 8/1999 | Takeuchi | |
| 6,118,077 A | 9/2000 | Takeuchi | |
| 6,900,715 B2 * | 5/2005 | Miettinen | ............. H01F 17/062 336/229 |
| 2013/0222103 A1 | 8/2013 | Kawai | |

FOREIGN PATENT DOCUMENTS

| | | |
|---|---|---|
| CN | 202732471 U | 2/2013 |
| CN | 202771896 U | 3/2013 |
| CN | 103680848 A | 3/2014 |

(Continued)

OTHER PUBLICATIONS

Google Machine English Translation of JPH07230915A, Performed on Jan. 25, 2017.*

(Continued)

*Primary Examiner* — Benny Lee
*Assistant Examiner* — Jorge Salazar, Jr.
(74) *Attorney, Agent, or Firm* — Blank Rome LLP

(57) ABSTRACT

Filter component having a windingless magnetic toroidal core with an opening, a toroidal core housing in which the toroidal core is fastened using a snap-on mechanism, wherein the filter component is designed such that a conductor can be run windinglessly through the opening of the toroidal core fastened in the toroidal core housing.

20 Claims, 3 Drawing Sheets

(56) References Cited

FOREIGN PATENT DOCUMENTS

| | | |
|---|---|---|
| DE | 9412107 U1 | 9/1994 |
| DE | 19730108 A1 | 1/1998 |
| DE | 69407728 T2 | 4/1998 |
| DE | 4223044 C2 | 12/2000 |
| DE | 102004025114 A1 | 2/2006 |
| EP | 0650172 A1 | 4/1995 |
| EP | 1807847 A0 | 5/2006 |
| EP | 2753161 A1 | 7/2014 |
| FR | 2147816 A1 | 3/1973 |
| JP | 07230915 A | 8/1995 |
| JP | 08167524 A | 6/1996 |
| JP | 2007266214 A | 10/2011 |
| JP | 2014096538 A | 5/2014 |

OTHER PUBLICATIONS

European Search Report for EP Application No. 15179900.4, dated Feb. 9, 2016, 8 pages.
German Search Report for Applicaton No. 102014112614.9 dated Jun. 21, 2015, 10 pages.

* cited by examiner

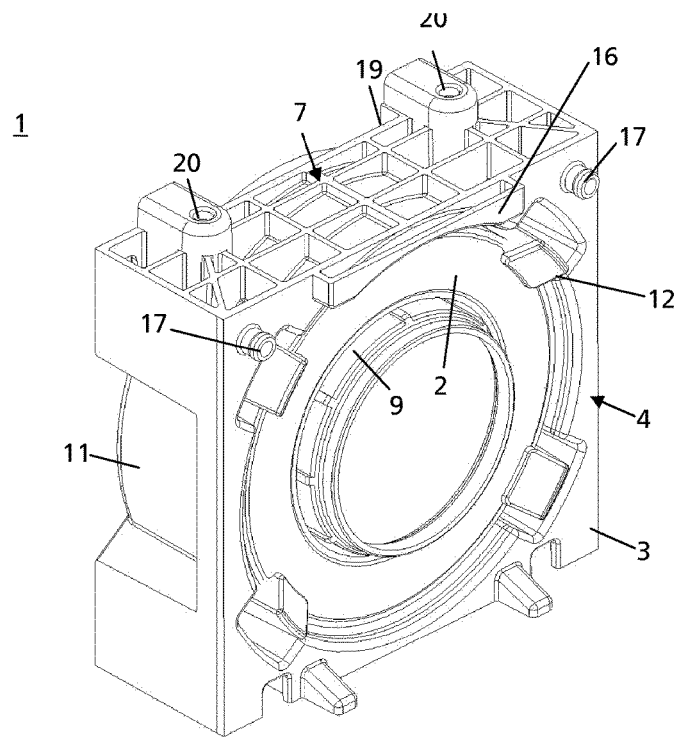
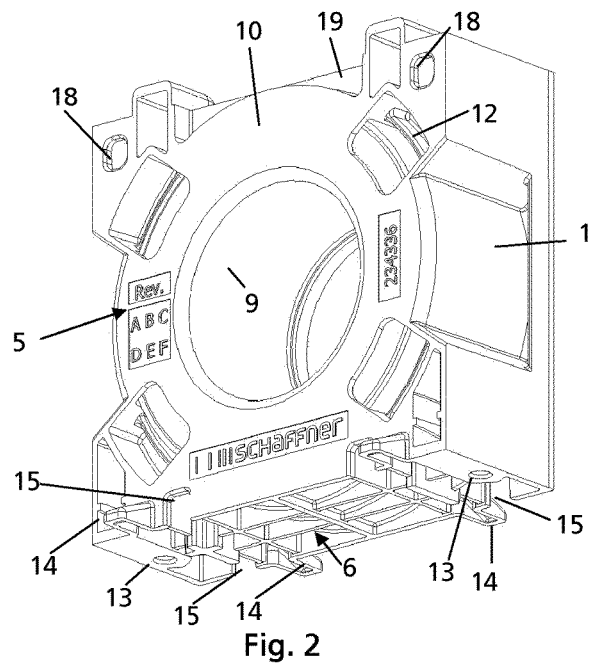 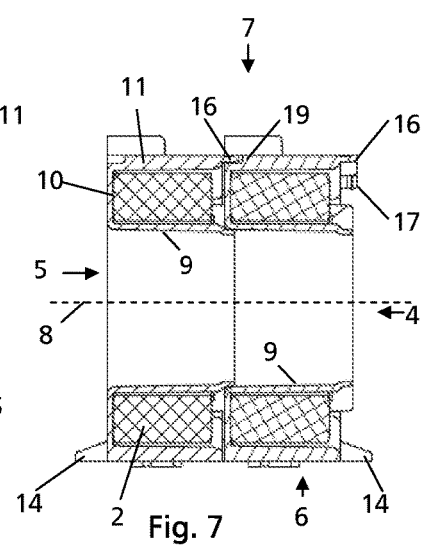
Fig. 1
Fig. 2    Fig. 7

FILTER COMPONENT WITH WINDINGLESS MAGNETIC TOROIDAL CORE

RELATED APPLICATION

This application claims priority to German Patent Application No. 102014112614.9, filed Sep. 2, 2014, the entire content of which is incorporated herein by reference.

FIELD OF THE INVENTION

The invention relates to a filter component with a windingless or coilless toroidal core, a filter assembly with a plurality of filter components, a filter assembly and a method for fastening the filter assembly resp. the filter component.

STATE OF THE ART

Coiled or windingless toroidal cores are often used in filters.

Coiled toroidal cores often require a housing that is fastened onto a fastening element, e.g. a board or a base plate. Furthermore, these coiled toroidal cores often require a connector in order to connect the conductor with the winding of the toroidal core. The documents EP0650172, CN202771896, FR2147816, EP1807847, CN103680848, CN202732471, DE69407728, DE102004025114 and DE102004025114 disclose such toroidal cores with windings which are inserted in a housing in the direction of the longitudinal axis of the opening of the ring core. In DE102004025114 and DE102004025114, the ring core is hold by a snap-fit mechanism in the housing.

Alternatively, windingless toroidal cores or ring cores are used. These are particularly simple, since the conductor is simply run through the opening of the toroidal core resp. the toroidal core is closed around the conductor. The toroidal core is then fastened to the conductor. Normally, this occurs by molding the toroidal core with the conductor. Such a molding of the toroidal core with the conductor, however, is laborious. Alternatively, there are also folding cores, consisting of two hollow cylinder halves that are fastened around a conductor by compression. However, these folding cores are complex to manufacture and require a new folding core for each core size. The documents JP000H08167524, U.S. Pat. No. 6,118,077, DE4223044, JP2007266214, U.S. Pat. No. 5,506,909, EP2753161, US20130222103 and DE19730108 disclose such folding cores, wherein each core half is fixed with a snap-on mechanism in a foldable housing which encompasses the conductor in its closed state.

The document JPH07230915 discloses a plurality of windingless torroidal cores which are mounted each in a respective housing. The housings can be concatenated so that toroidal cores of different sizes can be built together modularly. However, the mounting of the toroidal core in the housing is time consuming and complex, because the toroidal core is held by a housing cover whose mounting is complex, but which is necessary for concatenating the housing to a subsequent housing. In addition, the toroidal cores must be fixed in some way on the conductor which is also complex and time-consuming.

REPRESENTATION OF THE INVENTION

It is an aim of the invention to find a filter component with a windingless toroidal core that is easy to manufacture, that can be used in a modular fashion and/or that is easy to fit.

In one embodiment, this aim is achieved with a filter component having the following: a windingless magnetic toroidal core with a central opening. A toroidal core housing, in which the toroidal core is fastened using a snap-on mechanism. The filter component in this respect is executed in such a manner that a conductor can be guided without any winding around the core through the opening of the toroidal core fastened in the toroidal core housing.

The snap-on mechanism allows a simple assembly of the filter component without the requirement of molding the toroidal core with the conductor. Additionally, the toroidal core can be fastened via the housing to a fastening element and the conductor can be run also at a later stage through the opening of the toroidal core. However, the filter component can in some cases of course also be fastened to the conductor.

In one embodiment, this aim is achieved with a filter component having the following: a windingless magnetic toroidal core with an opening. A toroidal core housing, in which the toroidal core is held. The toroidal core housing then has a fastening surface by means of which the filter component can be fastened onto a level surface.

Thanks to the fastening surface, the housing of the windingless toroidal core can now be fastened directly onto a fastening element and no longer needs to be fastened to the conductor. This prevents a laborious molding or complex folding mechanisms for toroidal cores. In particular the fact that the conductor can be run loosely through the opening of the toroidal core in the toroidal core housing enables the filter to be already firmly installed and the conductors are pulled or inserted only during assembly through the toroidal core opening. This provides a simpler assembly procedure for toroidal cores.

In one embodiment, this aim is achieved with a filter assembly with a plurality of filter components. Each filter component has a windingless magnetic toroidal core with an opening and a toroidal core housing for fastening the toroidal core. The filter components are arranged side-by-side to one another in such a manner that the openings of the magnetic toroidal cores of the filter components provide a through opening for a conductor.

Such a filter assembly allows the toroidal core to be expanded in a modular fashion with the same filter component by arranging these filter components one after the other. Simultaneously, each filter component of the filter assembly can be fastened individually through its toroidal core housing. A mounted filter assembly can thus also be expanded by adding a further filter component, without removing the other filter components. A filter assembly can thus similarly also be reduced by removing one of the filter components. For this, only the one filter component needs to be detached. This is particularly advantageous in combination with the snap-on toroidal cores in the toroidal core housings as described above. Admittedly, the toroidal cores could also be fastened in other ways in the toroidal core housings, e.g. through pressure of the adjoining filter component or by a clamping mechanism. Using a housing for each toroidal core further has the advantage that no different housings need to be provided for different numbers of toroidal cores.

In one embodiment, this aim is achieved by means of a system. The system has a fastening element, at least one of the described filter components or one of the described filter assemblies. The at least one filter component or the filter assembly is fastened onto the fastening element. The system further has a conductor that is run in a windingless manner through the opening of each toroidal core of the at least one filter component or of the filter assembly.

In one embodiment, this aim is achieved through a method having the following steps: fastening a filter assembly or a filter component as described above onto a fastening element and running a conductor through an opening of the toroidal core or the toroidal cores after fastening of the filter assembly or of the filter component.

The idea of fastening a windingless toroidal core through a housing on a fastening element avoids the laborious connecting of the toroidal cores with the conductor, in particular for a larger number of toroidal cores. Simultaneously, the system can already be completely installed before the conductor is run through the toroidal cores.

Other advantageous embodiments are indicated in the dependent claims.

In one embodiment, the snap-on mechanism is designed such that the toroidal core can be inserted in the toroidal core housing in the direction of a longitudinal axis of the opening of the toroidal core.

In one embodiment, the snap-on mechanism has several elastic clamps that are formed in such a way that the clamps open when the toroidal core is pressed against the toroidal core housing, and that they hold the toroidal core after the clamps have snapped on.

In one embodiment, the toroidal core is arranged in a recess of the toroidal core housing corresponding to the toroidal core.

In one embodiment, the toroidal core housing has an inner wall that covers the wall in the opening of the toroidal core, and an outer wall that covers an outer wall of the toroidal core opposite the opening. In this manner, the toroidal core is insulated vis-à-vis the conductor and towards the outside.

In one embodiment, the toroidal core housing has a first fastening surface for fastening the toroidal core housing, placed in parallel to a longitudinal axis of the opening of the toroidal core.

In one embodiment, the toroidal core housing has a second fastening surface for fastening a further assembly onto the toroidal core housing, placed in parallel to the longitudinal axis of the opening of the toroidal core.

In one embodiment, the first fastening surface is placed in parallel to the second fastening surface.

In one embodiment, the first fastening surface and/or the second fastening surface have recesses for fastening means. Fastening means are preferably rivets or screws. In one embodiment, the recess is suitable both for fastening rivets and for inserting a nut for fastening a screw.

In one embodiment, the first fastening surface has two recesses for fastening means and four protruding feet for increasing the footprint.

In one embodiment, the toroidal core housing has a toroidal core side for inserting the toroidal core and a toroidal core rear side opposite the toroidal core side, wherein the toroidal core side has two feet protruding in the direction of the longitudinal axis of the opening and wherein the toroidal core rear side has two feet protruding in the direction of the longitudinal axis of the opening and which are arranged in an offset fashion to the two feet of the toroidal core side, wherein the toroidal core side has two feet recesses for each accommodating one of the feet and arranged opposite the two feet of the toroidal core rear side, and wherein the toroidal core rear side has two feet recesses for each accommodating one of the feet and arranged opposite the two feet of the toroidal core side. Thus, the footprint of each individual toroidal core housing can be increased without increasing the effective width of the toroidal core housing in a stack of toroidal core housings. Simultaneously, the form-fitting slotting of the feet allows the transmission of axial forces from one toroidal core housing to the next. This stabilizes toroidal core housings plugged together in a modular fashion.

In one embodiment, the toroidal core housing has a toroidal core side for inserting the toroidal core and a toroidal core rear side opposite the toroidal core side, wherein the toroidal core side and the toroidal core rear side of the toroidal core housing are designed such that when the filter component is placed with the toroidal core side in connection to a toroidal core rear side of a filter component of same construction, a radial movement of the filter components to one another relative to the longitudinal axis of the opening of the toroidal core would be prevented due to perfect form-fit.

In one embodiment, the toroidal core side and the toroidal core rear side of the toroidal core housing are designed such that when the filter component is placed with the toroidal core side connected to a toroidal core rear side of a filter component of same construction, the arrangement is possible only in one positioning.

In one embodiment, the toroidal core side and the toroidal core rear side of the toroidal core housing have each at least one fastening snap-in element which, when the filter component is placed with the toroidal core side connected to a toroidal core rear side of a filter component of same construction, a snap-in connection would be created between the filter component and the filter component of same construction.

In one embodiment of a filter assembly, filter components are executed in the same construction. In this way, it is possible to assemble, by linking them up, toroidal cores of any size by means of a filter component type.

In one embodiment of the system, the conductor is not fastened to the at least one filter component or to the filter assembly resp. the conductor is loose.

In one embodiment of the system, the filter assembly is fastened to an intermediate plate and the intermediate plate is fastened onto the fastening element.

In one embodiment of the system, the at least one filter component or the filter assembly has recesses for the fastening and the at least one filter component of the filter assembly is fastened through these recesses by means of rivets or screws to the fastening element or the intermediate plate.

SHORT DESCRIPTION OF THE FIGURES

The invention will be explained in more detail on the basis of the attached figures, wherein FIG. 1 shows a first three-dimensional view of an embodiment of the inventive component;

FIG. 2 shows a second three-dimensional view of the embodiment of the inventive component;

FIG. 7 shows the section A-A of FIG. 3 of the embodiment of the inventive assembly;

WAYS OF EXECUTING THE INVENTION

Figure 9:
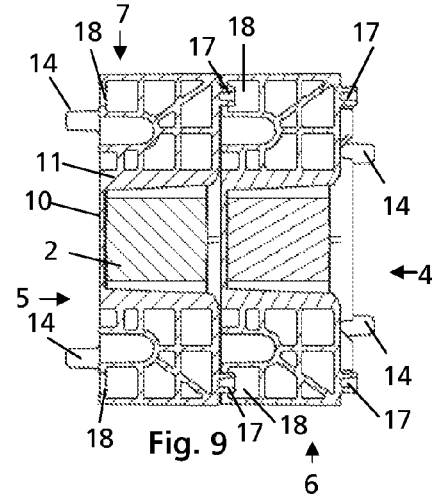
FIG. 9 shows the section D-D of FIG. 4 of the embodiment of the inventive assembly.
Figure 10:
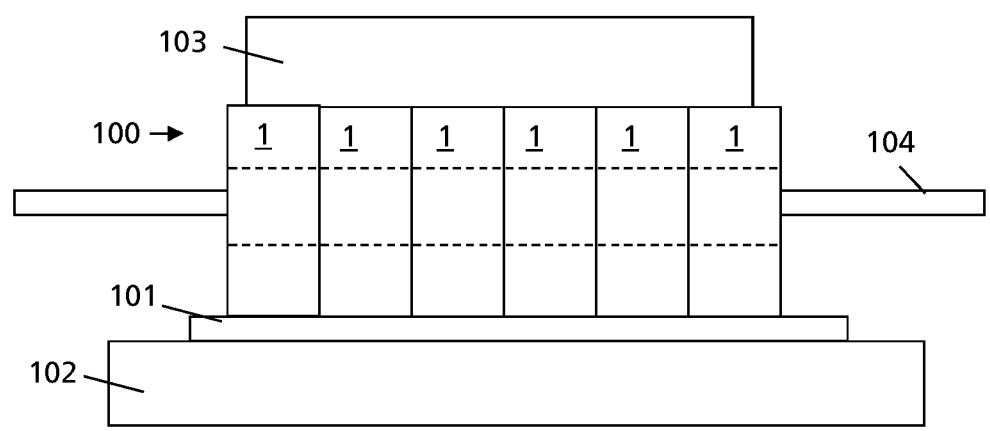
FIG. 10 shows a filter with a filter assembly.

FIGS. 1 and 2 show two three-dimensional views of an embodiment of the inventive filter component 1. FIGS. 3 to 9 show different views and sections of an embodiment of the inventive filter assembly 100. FIG. 10 shows a filter with a filter group 100.

A filter group has a plurality of filter components 1. The filter assembly 100 shown in FIGS. 3 to 9 has two filter components 1. However, the filter group 100 can have any other number of filter components 1. The filter group 100 can also have other inventive filter components than the filter components 1. The embodiment shown in FIGS. 3 to 9 is however the filter component 1. In this embodiment, the filter assembly comprises filter components 1 of same construction. However, different filter components 1 can also be used in the filter assembly 100. The filter components 1 of a filter assembly 100 are arranged one after the other (concatenated) so that they form a larger toroidal core with a common opening in order to run a conductor, e.g. a cable, a (rigid) busbar or any other current conducting means through the common opening. In the shown filter assembly 100, a first filter component 1 and a second filter component 1 are used for the filter assembly 100.

The filter component 1 has a toroidal core 2 and a toroidal core housing 3.

The toroidal core 2 here is shaped as a circular straight hollow cylinder with a central opening. However, the invention is not limited to such an annular shape. Instead, every core shape with a central opening that is designed for windinglessly running a conductor is possible for the toroidal core. The central opening of the toroidal core 2 should have a straight longitudinal axis 8 that is arranged preferably perpendicular to the two sides of the toroidal core 2 having the opening. The toroidal core 2 can, instead of a circular shape, also have an elliptical, quadratic, multi-angular, polygonal, general or other section. It is preferably a straight hollow cylinder, i.e. the inner and outer lateral surfaces of the hollow cylinder stand vertically on the base surfaces. However, inclined hollow cylinders are also possible. The toroidal core 2 in this embodiment is closed. The toroidal core 2 can also be executed open, i.e. there is no closed path in the toroidal core 2 that encircles the opening. The toroidal core 2 is made of a magnetic material, preferably of a ferromagnetic material.

Figure 5:
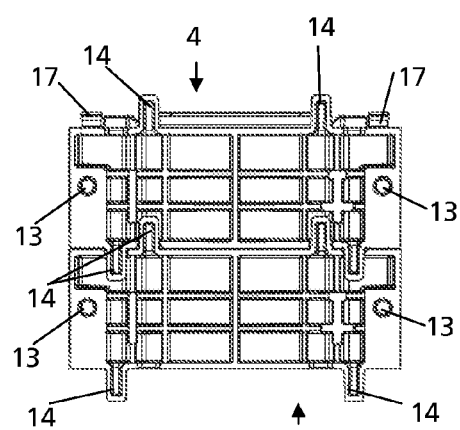
FIG. 5 shows a third side view of the embodiment of the inventive assembly.
Figure 8:
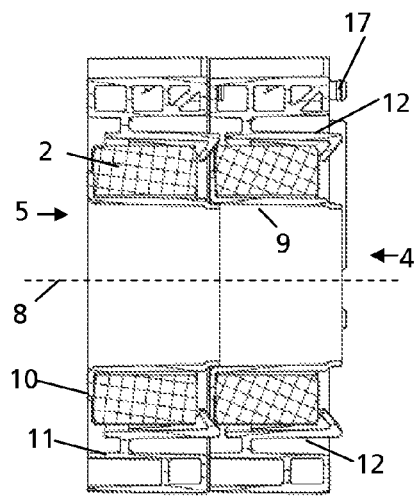
FIG. 8 shows the section B-B of FIG. 3 of the embodiment of the inventive assembly.
Figure 3:
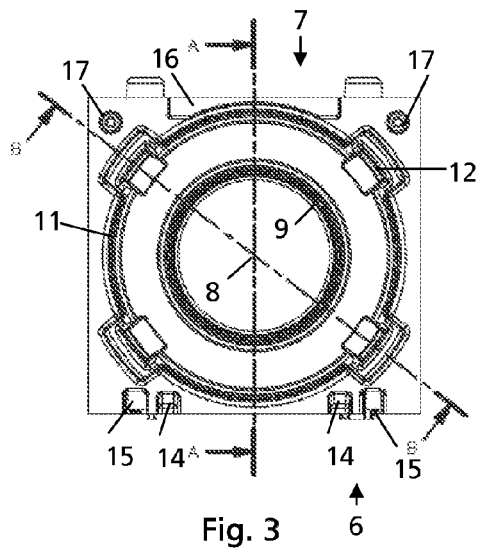
FIG. 3 shows a first side view of the embodiment of an inventive assembly.
Figure 4:
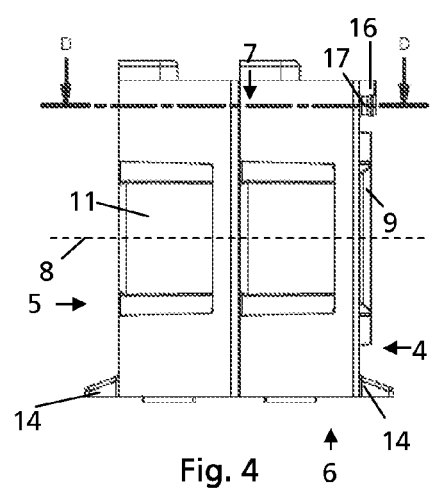
FIG. 4 shows a second side view of the embodiment of an inventive assembly.
Figure 6:
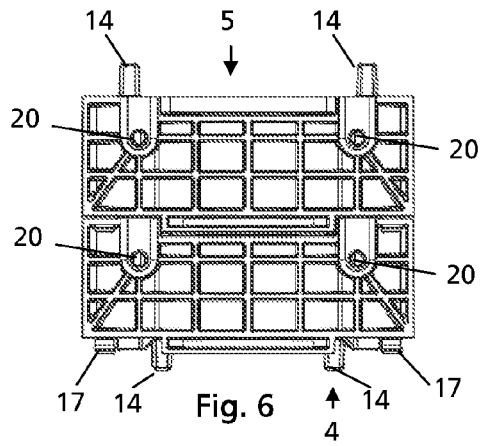
FIG. 6 shows a fourth side view of the embodiment of the inventive assembly.

The toroidal core housing 3 is a housing for the toroidal core 2. The toroidal core housing 3 is preferably made of an electrically insulating material. The toroidal core housing 3 has a toroidal core side 4, a toroidal core rear side 5 opposite the toroidal core side 4, a first fastening side 6 and a second fastening side 7. The toroidal core side 4 is shown in topview in FIG. 3 and in perspective in FIG. 1 (FIG. 7 shows the section of A-A of FIG. 3). The toroidal core rear side 5 is shown in perspective in FIG. 2. The first fastening side 6 is shown in topview in FIG. 5 and in perspective in FIG. 2. The second fastening side 7 is shown in topview in FIG. 6 and in perspective in FIG. 1. In this embodiment, the toroidal core side 4 and the toroidal core rear side 5 are placed in parallel to one another. In another embodiment, the toroidal core side 4 and the toroidal core rear side 5 can create an angle, which however allows the toroidal core housings 3 to be stacked. In this way, a common longitudinal axis of the openings of the toroidal cores 2 can thus preferably be achieved. In this embodiment, the fastening side 6 is arranged opposite the second fastening side 7, preferably in parallel to it. However, the second fastening side 7 can also be arranged differently or be completely omitted. In this embodiment, the first fastening side 6 is placed perpendicular to the toroidal core side 4 and/or to the toroidal core rear side 5. In this embodiment, the first fastening side 6 is also parallel to the longitudinal axis 8 of the opening of the toroidal core 2, so that when the toroidal core housing is fastened onto a flat fastening element, the longitudinal axis 8 of the opening of the toroidal core 2 runs parallel to the flat fastening element (resp. to its fastening surface). FIG. 4 shows one of the two sides of the toroidal core housing 3 which in this embodiment, in addition to the four sides already mentioned, form the fifth and sixth side of a cuboid. However, the fifth and sixth side have no function and could also be formed differently. The height and width of the toroidal core side 4 and of the toroidal core rear side 5 and the lengths of the other four sides are greater than the cross section of the toroidal core 2. The width of the other four sides is greater than the thickness or corresponds to the thickness of the toroidal core 2, i.e. the dimension in the direction of the longitudinal axis 8 of the opening of the toroidal core 2.

The first fastening side 6 of the toroidal core housing 3 has fastening means in order to fasten the toroidal core housing 3 with the first fastening side 6 to a fastening element. Two fastening recesses 13 are provided here as fastening means, preferably placed at the two ends of the longer side of the first fastening side 6 and/or in the middle in relation to the shorter side of the first fastening side 6. The fastening recesses 13 are designed for receiving rivets and/or nuts. To this effect, a hollow space is provided behind the fastening recesses 13, in which the rivet can expand behind the fastening recess. The hollow space of the fastening recess 13 is alternatively or additionally designed for accommodating a nut, so that the toroidal core housing 3 can be screwed on. The nut can be inserted for example from the toroidal core rear side. The hollow space preferably has anti-rotation means and/or means for securing a positioning of the nut. The fastening side is preferably designed flat in order to fasten the toroidal core housing 3 on a flat fastening element. In this embodiment, the footprint of the first fastening side 6 is increased by four feet 14, which extend as protrusions in the same plane as the first fastening side 6 from the toroidal core side 4 and the toroidal core rear side 5. This makes it possible to increase the footprint of the toroidal core housing 3. This is particularly advantageous if only one toroidal core housing 3 or only a small number of toroidal core housings 3 are fastened. In this embodiment, two feet 14 are arranged on the toroidal core side 4 and two feet 14 on the toroidal core rear side 5. The feet 14 of the toroidal core side 4 are arranged in an offset fashion to the feet 14 of the toroidal core rear side 5. This is clearly to be seen in FIGS. 5, 6 and 9. Simultaneously, feet recesses 15 are provided in the toroidal core side 4 opposite the position of the feed of the toroidal core rear side 5 and feet recesses 15 in the toroidal core rear side 5 opposite the position of the feed of the toroidal core side 4. Each feet recess 5 is adapted to receive a foot 14. It is thus possible to place two filter components 1 with the toroidal core side 4 directly to the toroidal core rear side 5 of the second filter component 1. The feet 14 of the toroidal core side 4 of the first filter component 1 are thus completely accommodated in the feet recesses 15 of the toroidal core rear side 5 of the second filter component 1. The feet 14 of the toroidal core rear side 5 of the second filter component 1 are thus completely accommodated in the feet recesses 15 of the toroidal core side 4 of the first filter component 1 (see FIG. 5). The toroidal core side 4 of the first filter component 1 can thus be placed flat and flush to the toroidal core rear side 5 of the second filter component 1. In the shown embodiment, a first fastening side 6 can have at least one protrusion, here two protrusions, which in the attached state engage(s) in correspondingly formed recesses of the fastening element. The protrusion or protrusions are designed in such a way that the housing can be fastened only in the correct orientation on the fastening element. This is achieved here through an I-shaped protrusion and an X-shaped protrusion. But any other shape of protrusion or protrusions is also possible. This principle is also called Poka Yoke.

The second fastening side 7 of the toroidal core housing 3 also has fastening means in order to fasten further components of the filter on the filter component 1 resp. the filter assembly 100. Two fastening recesses 20 are provided here as fastening means, preferably placed at both ends of the longer side of the first fastening side 6 and/or approximately in the middle in relation to the shorter of the first fastening sides 6. The fastening recesses 20 are designed for receiving rivets. To this effect, a hollow space is provided behind the fastening recesses 20, in which the rivet can expand behind the fastening recess 20. The filter assembly 100 thus, by means of the second fastening sides 7 of the filter components 1, forms a fastening surface with at least four fastening points, so that on the filter assembly 100 further components can be fastened in a particularly stable manner. Simultaneously, the filter components 1 of the filter assembly are stabilized among one another using this fastening. In this embodiment, the second fastening side 7 is executed in a flat manner. The fastening recesses 20 are placed in corresponding protrusions from the second fastening side 7. Thus, a spaced-out fastening of the further component is achieved and thus a heat transmission from the toroidal cores 2 to the further component is avoided. The second fastening side 7, however, is optional and not essential for the invention.

The toroidal core side 4 of the toroidal core housing 3 has a recess for inserting and receiving the toroidal core 2. The shape of the recess corresponds to the projection of the toroidal core 2 on a surface perpendicular to the longitudinal axis 8 of the toroidal core (for a straight hollow cylinder, this corresponds to the section resp. the base area of the hollow cylinder). The toroidal core housing 3 furthermore has an opening that runs from the toroidal core side 4 to the toroidal core rear side 5. In this embodiment, the longitudinal axis of the opening of the toroidal core housing 3 is identical with the longitudinal axis 8 of the opening of the toroidal core 2. In other embodiments, these two longitudinal axes could also be arranged only in parallel or even at a slight angle to one another. In this embodiment, the section of the opening of the toroidal core housing 3 is circular. However, the section of the opening of the toroidal core housing 3 can also have other shapes. The shape of the section preferably corresponds to the opening of the toroidal core 2. The recess for inserting and receiving the toroidal core 2 has an outer wall 11, a rear wall 10 and an inner wall 9. The outer wall 11 covers the outer side (here outer wall of the hollow cylinder) of the toroidal core 2. The inner wall 9 covers the inner wall (here inner wall of the hollow cylinder) of the toroidal core 2. The rear wall 10 covers the rear side (here one of the base areas of the hollow cylinder) of the toroidal core 2. In this embodiment, the toroidal core housing 3, or at least the inner wall 9, the rear wall 10 and the outer wall 11, are made of an electrically insulating material. The toroidal core 2 is thus insulated vis-à-vis these three sides.

The toroidal core housing 3 furthermore has a snap-on or snap-fit mechanism that is designed to open when the toroidal core 2 is inserted in the toroidal core housing 3 and to snap shut when the position of the toroidal core 2 has been reached. In the snapped-on state, the snap-on mechanism holds the toroidal core 2 in its position through form-fitting. In this embodiment, the snap-on mechanism is placed in the recess of the toroidal core side 4. In this embodiment, the snap-on mechanism is executed by at least one snap-on lever 12. In this embodiment, four snap-on levers 12 are used. However, it would also be possible to use two, three, five or more snap-on levers 12 or other snap-on mechanisms. The snap-on levers 12 in this embodiment are distributed around the outer circumference of the toroidal core. Alternatively, these could also be distributed over the inner circumference or both circumferences. Each snap-on lever 12 is fastened at a leverage point in the toroidal core housing 3, preferably at the outer wall 11. The leverage point is preferably placed more in the direction of the rear wall 10 than in the direction of the toroidal core side 2, in order to achieve a lever that is as long as possible. On the side of the lever arm arranged opposite the leverage point, the snap-on lever 12 has a lever head. The lever head in its snapped-in position blocks the toroidal core 2 snapped-in in the toroidal core housing 3 and prevents it from moving in the direction of the longitudinal axis of the opening and/or in the direction of the normal of the toroidal core side 4. In this embodiment, the lever head of the snap-on lever 12 is designed such that the snap-on lever or levers 12 move in an opening position when the toroidal core 2 is inserted in its position in the toroidal core housing (in the recess). This is achieved by a surface slanting downwards in the direction of the middle of the toroidal core 2. Thanks to the judicious alignment of the lever head, the toroidal core 2, which when inserted presses onto the inclined surface, thus presses the snap-on levers 12 away from one another in an opening position. This allows the toroidal core 2 to automatically open the snap-on mechanism when inserted. In this embodiment, indentations are provided in the outer wall in the area of the snap-on levers 12, which enable freedom of movement of the snap-on lever 12 from the snapped-in position to the open position that allows the toroidal core 2 to be inserted. Alternatively, the distance between the outer wall 11 and the outer side of the toroidal core 2 could be designed so large that the snap-on lever 12 even without indentations could have enough freedom of movement radially to the longitudinal axis of the opening of the toroidal core housing. Two of the four snap-on levers 12 are particularly well represented in the cross section B-B in FIG. 8. The snapped-in snap-on levers 12 and the rear wall 10 of the recess thus prevent a movement of the toroidal core in the direction of insertion and withdrawal of the toroidal core 2. A movement perpendicular to this direction of movement, i.e. radially thereto, is thus prevented, in that the inner side of the toroidal core lies flush to the inner wall 9. The tolerances of the toroidal core are absorbed by crimping ribs on the inner wall 9. Simple form-fitting thus prevents a movement of the toroidal core 2 radially to the longitudinal axis of the inner wall. The snapped-in toroidal core 2 is thus easy to assemble and yet held firmly in position vis-à-vis the toroidal core housing 3. On the toroidal core rear side 5, the rear wall 10 is recessed in the area of the snap-on levers 12. The snap-on levers 12 can thus for example be opened simultaneously using a special tool, in order to remove again the toroidal core 2 from the toroidal core housing. Simultaneously, these openings make it possible to exert a pressure on the toroidal core 2 from the toroidal core rear side 5 in the direction of the toroidal core side 4, in order to be able to also remove the toroidal core 2 out of the toroidal core housing 3 again. This is possibly necessary if the toroidal core 2 becomes damaged and needs to be replaced.

The toroidal core side 4 of the toroidal core housing 3. This embodiment further has at least one protrusion 16, which is provided opposite a corresponding recess 19 on the toroidal core rear side 5. In the filter component group 100, the protrusion 16 of the toroidal core side 4 of the first filter component engages in the recess 19 of the toroidal core rear side 5 of the second filter component 1. This makes it possible to achieve that the filter components 1 of a filter assembly 100 can be positioned only in one direction to one another. The choice as to which of the toroidal core side 4 and of the toroidal core rear side 5 now contains the protrusion or the corresponding recess is irrelevant. Alternatively, this function could also be achieved by the feet 14 and the feet recesses 15. In this embodiment, the toroidal core side 4 of the filter component additionally has one or several snap-in elements 17 that are placed opposite snap-in recesses 18 provided on the toroidal core rear side 5. The snap-in elements 17 are designed to snap into the snap-in recesses 18 of the toroidal core rear side 5 of the second filter component 1 when two filter components 1 are pressed against one another in the correct position. In the snapped-in state, the at least two filter components 1 of the filter assembly 100 are fastened to each other and can only be separated by the two filter components 1 being pulled apart with a force that exceeds a threshold value. A filter assembly 100 can thus be simply stuck together with any arbitrary number of filter components 1 without the individual filter components 1 having to be held in their relative position until they are fastened on the fastening element. FIG. 9 shows a section through the filter assembly 100 through the snap-in elements 17 and the snap-in recesses 18. Two of these snap-in elements 17 are preferably placed on the toroidal core side 2. Preferably, two snap-in elements 17 are provided on the toroidal core side 2 in the direction of the second fastening side 7 resp. opposite the first fastening side 6. In this manner, the filter components 1 in the filter assembly 100 are held together relative to the first fastening side 6, even if no further component is fastened on the filter assembly 100 or if there is no second fastening side 7.

In this embodiment, the inner wall 9 protrudes somewhat beyond the toroidal core side 4 of the toroidal core housing 3. In the area of this protrusion, the cone formed by the inner wall 9 tapers in its diameter continuously or step-wise. The toroidal core rear side 5 has a receiving recess for accommodating this tapered cone of the inner wall 9. The receiving recess is here also executed by the inner wall 9. Since the opening for running a conductor in the toroidal core housing 3 is also formed by the inner wall 9, the meshing of the tapered inner wall 9 on the toroidal core side 4 of the first filter component 1 in the inner wall 9 on the toroidal core rear side 5 of the second filter component 1 makes it possible to achieve that the openings of the toroidal core housing 3 are aligned one with another.

FIG. 10 now shows a schematic arrangement of a filter, e.g. an EMC filter (EMC: electro-magnetic compatibility). The filter is fastened onto a fastening element 102. The filter has an optional intermediate plate 101, a filter assembly 100 with a plurality of filter components 1, an optional further component 103 and a conductor 104. The filter assembly 100 is fastened on the intermediate plate 101, wherein the latter is then fastened on the fastening element 102. However, the filter assembly 100 can also be fastened directly onto the fastening element 102. The assembled filter components 1 of the filter assembly 100 are riveted onto the intermediate plate 101 or onto the fastening element 102. For this purpose, the rivets are inserted through the two fastening recesses 13 of each and every filter component 1 and fastened. Alternatively, screws and other fastening means can also be used. Optionally, a further component 103 is fastened onto the filter assembly 100. To this effect, the further component 103 is riveted via the fastening recesses 20 of the filer component 1 of the filter assembly 100 or fastened in any other way. The further component 103 can also serve to stabilize the filter components 1 of the filter assembly 100 to one another. The filter assembly 100 can thus be fastened already without the conductor 104 that is to be filtered. The conductor or conductors 104 can be run at the end through the opening of the filter assembly 100, i.e. through the openings of the toroidal cores 2 and of the toroidal core housing 3 of the filter components 1. Fastening the windingless toroidal cores 2 to the conductor 104 is no longer necessary. It is thus possible to omit the laborious fastening of the windingless toroidal cores 2 to the conductor 104. Simultaneously, however, the windingless toroidal core 2 is fastened. The conductor 104 can be a cable or a rigid bus bar. In the case of a rigid bus bar, it is advantageous to also fasten it to the fastening element 102 or to the intermediate plate 101, so that the bus bar is firmly in position relative to the toroidal cores 2. In an alternative embodiment, the filter assembly 100 can also have only one filter component 1.

One advantage of the invention lies in the fact that it is not necessary to laboriously fasten the conductor to the filter components 1 resp. to the toroidal cores 2.

Another advantage is that the assembly, the variation in size and the fastening of the filter assembly 100 are particularly easy. The number of filter components 1 of the filter assembly 100 is chosen depending on the required size of the windingless toroidal core 2. For each filter component, the toroidal core 2 is inserted in the toroidal core housing 3. All filter components are plugged together (stacked) resulting in the toroidal core of the desired size. It is now only necessary to fasten the assembled filter assembly 100 and to run a conductor 104 through the opening of the filter assembly 100.

The invention claimed is:
1. Filter component having:
   a windingless magnetic toroidal core with an opening;
   a toroidal core housing, in which the toroidal core is fastened with a snap-fit mechanism, wherein the snap-fit mechanism is designed such that the toroidal core can be inserted in a direction of a longitudinal axis of the opening of the toroidal core in the toroidal core housing;
   wherein the filter component is designed such that a conductor can be run windinglessly through the opening of the toroidal core fastened in the toroidal core housing,
   wherein the snap-fit mechanism has one or several moving levers that are formed in such a way that the one or several moving levers open when the toroidal core is pressed against the toroidal core housing and hold directly the toroidal core after the one or several moving levers have snapped-in.
2. Filter component according to claim 1, wherein the toroidal core housing has an inner wall that covers a wall of the toroidal core in the opening of toroidal core, and an outer wall that covers an outer wall of the toroidal core opposite the opening of the toroidal core.
3. Filter component according to claim 1, wherein the toroidal core has a form of a hollow cylinder and the one or several moving levers are formed in such a way that the one or several moving levers open in a direction radially away from the longitudinal axis of the opening of the toroidal core, when the toroidal core is pressed against the toroidal core housing.

4. Filter component according to claim 1, wherein the toroidal core is arranged in a recess of the toroidal core housing corresponding to the toroidal core.

5. Filter component according to claim 1, wherein the toroidal core housing has a first fastening surface for fastening the toroidal core housing to a fastening element, wherein the first fastening surface is arranged in parallel to the longitudinal axis of the opening of the toroidal core.

6. Filter component according to claim 5, wherein the first fastening surface has four protruding feet for increasing the footprint of the toroidal core housing, wherein the toroidal core housing has a toroidal core side for inserting the toroidal core and a toroidal core rear side opposite the toroidal core side, wherein the toroidal core side comprises two of the four feet protruding in the direction of the longitudinal axis of the opening, wherein the toroidal core rear side comprises the other two of the four feet protruding in the direction of the longitudinal axis of the opening, wherein the other two of the four feet of the toroidal core rear side are arranged in an offset fashion to the two of the four feet of the toroidal core side, wherein the toroidal core side has two feet recesses arranged opposite the other two feet of the toroidal core rear side, and wherein the toroidal core rear side has the other two feet recesses arranged opposite the two feet of the toroidal core side.

7. Filter component according to claim 5, wherein the toroidal core housing has a second fastening surface for fastening a further component onto the toroidal core housing, arranged in parallel to the longitudinal axis of the opening of the toroidal core.

8. Filter assembly with a plurality of filter components, each filter component comprising:
   a windingless magnetic toroidal core with an opening;
   a toroidal core housing, in which the toroidal core is fastened by a mechanism designed such that the toroidal core can be inserted in the direction of a longitudinal axis of the opening of the toroidal core in the toroidal core housing;
   wherein each toroidal core housing has a toroidal core side and a toroidal core rear side opposite the toroidal core side, wherein the plurality of filter components are arranged in a cascaded manner, so that the toroidal core side of one of the filter components abuts to the toroidal core rear side of a neighboring filter component and so that a conductor can be run windinglessly through the openings of the toroidal cores fastened in the toroidal core housings of the filter components,
   wherein the toroidal core side has two feet protruding in the direction of the longitudinal axis of the opening and the toroidal core rear side has two feet protruding in the direction of the longitudinal axis of the opening.

9. Filter assembly according to claim 8, wherein each of the toroidal core side has two feet recesses and each of the toroidal core rear side has two feet recesses, wherein the two protruding feet of the toroidal core rear side are arranged in an offset fashion to the two protruding feet of the toroidal core side and the two feet recesses of the toroidal core rear side are arranged in an offset fashion to the two feet recesses of the toroidal core side such that the two feet recesses of the toroidal core side accommodate the two protruding feet of the toroidal core rear side of a neighboring filter component and/or the two feet recesses of the toroidal core rear side accommodate the two protruding feet of the toroidal core side of a neighboring filter component.

10. Filter assembly according to claim 8, wherein each toroidal core housing has a first fastening surface for fastening the toroidal core housing, arranged in parallel to the longitudinal axis of the opening of the toroidal core, wherein the first fastening surfaces of all filter components form a common first fastening surface of the filter assembly.

11. Filter assembly according to claim 10, wherein each toroidal core housing has a second fastening surface for fastening a further component onto the toroidal core housing, arranged in parallel to the longitudinal axis of the opening of the toroidal core, wherein the second fastening surfaces of all filter components form a common second fastening surface of the filter assembly.

12. Filter assembly according to claim 8, wherein filter components are constructed in the same way.

13. Filter assembly according to claim 8, wherein the toroidal core side of at least one filter component is fixed to the toroidal core rear side of a neighboring filter component such that a radial and/or rotational movement of the two filter components relative to the longitudinal axis of the opening of the toroidal core would be prevented due to form-fit.

14. Filter assembly according to claim 13, wherein the toroidal core side and the toroidal core rear side of the toroidal core housing have each snap-fit elements which, when the toroidal core side of each filter component is cascaded with the toroidal core rear side a neighboring filter component, create a snap-fit connection between the filter component and the neighboring filter component.

15. Filter assembly according to claim 13, wherein an inner wall of each toroidal housing surrounding the opening of the corresponding toroidal core has a tapering on the toroidal core side so that the inner wall on the toroidal core rear side of a neighboring filter component sits on the tapering of the inner wall by form-fit.

16. Filter assembly according to claim 15, wherein the toroidal core side and the toroidal core rear side of each toroidal core housing comprise a combination of a protrusion and a recess such that the cascading of neighboring filter components is possible only in one positioning and such that the rotational movement of the cascaded neighboring filter components around the longitudinal axis of the opening is prevented.

17. Filter assembly according to claim 8, having additionally
   a fastening element for fastening the filter components of the filter assembly.

18. Filter assembly according to claim 17, wherein the filter assembly is fastened onto an intermediate plate and the intermediate plate is fastened onto the fastening element.

19. Filter assembly according to claim 17, wherein each filter component has recesses for fastening each filter component to the fastening element or to an intermediate plate through these recesses by means of rivets or screws.

20. Filter component having:
   a windingless magnetic toroidal core with an opening;
   a toroidal core housing, in which the toroidal core is fastened with a snap-fit mechanism, wherein the snap-fit mechanism is designed such that the toroidal core can be inserted in a direction of a longitudinal axis of the opening of the toroidal core in the toroidal core housing;

wherein the filter component is designed such that a conductor can be run windinglessly through the opening of the toroidal core fastened in the toroidal core housing, wherein the snap-fit mechanism has at least two moving levers that are formed in such a way that the at least two moving levers open when the toroidal core is pressed against the toroidal core housing and, after the at least two moving levers have snapped-in, they hold the toroidal core.

* * * * *